(12) United States Patent
Yasuda et al.

(10) Patent No.: US 7,772,905 B2
(45) Date of Patent: Aug. 10, 2010

(54) SEMICONDUCTOR INTEGRATED CIRCUIT APPARATUS

(75) Inventors: Shinichi Yasuda, Yokohama (JP); Keiko Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 11/859,878

(22) Filed: Sep. 24, 2007

(65) Prior Publication Data
US 2009/0108896 A1 Apr. 30, 2009

(30) Foreign Application Priority Data
Sep. 27, 2006 (JP) ............... 2006-262700

(51) Int. Cl.
*H03K 3/289* (2006.01)
(52) U.S. Cl. .............. 327/202; 327/141; 327/201; 327/211
(58) Field of Classification Search ......... 327/141–142, 327/199, 201–203, 207, 211–213, 215–218; 365/49.11
See application file for complete search history.

(56) References Cited

U.S. PATENT DOCUMENTS

| | | | |
|---|---|---|---|
| 5,498,988 A * | 3/1996 | Reyes et al. ............ | 327/199 |
| 6,205,192 B1 * | 3/2001 | Igura ..................... | 375/354 |
| 6,822,478 B2 * | 11/2004 | Elappuparackal ...... | 326/46 |
| 2002/0087930 A1 * | 7/2002 | Kanba ................... | 714/726 |
| 2004/0199821 A1 | 10/2004 | Flautner et al. | |

FOREIGN PATENT DOCUMENTS

| | | |
|---|---|---|
| JP | 2000-232339 | 8/2000 |
| JP | 2004-056667 | 2/2004 |

OTHER PUBLICATIONS

Notification of Reason for Rejection issued by the Japanese Patent Office on Jun. 17, 2008, for Japanese Patent Application No. 2006-262700, and English-language translation thereof.

* cited by examiner

*Primary Examiner*—Lincoln Donovan
*Assistant Examiner*—Shikha Goyal
(74) *Attorney, Agent, or Firm*—Finnegan, Henderson, Farabow, Garrett & Dunner, L.L.P.

(57) ABSTRACT

It is made possible to provide a flip-flop circuit capable of implementing the error correction function with a small area increase as far as possible and a pipeline system using such a flip-flop circuit. A flip-flop circuit includes: a flip-flop configured to operate based on a rising edge or a falling edge of a first clock signal; a decision circuit configured to compare an input of the flip-flop with an output thereof and output a request signal when the input of the flip-flop is different from the output thereof; and a control circuit configured to receive a second clock signal from outside and generate the first clock signal and a confirmation signal. When the request signal is sent from the decision circuit after the flip-flop has been activated, the control circuit inverts the first clock signal, sends the confirmation to the decision circuit, and makes the decision circuit cancel the request signal.

18 Claims, 17 Drawing Sheets

SEMICONDUCTOR INTEGRATED CIRCUIT APPARATUS

CROSS-REFERENCE TO RELATED APPLICATION

This application is based upon and claims the benefit of priority from prior Japanese Patent Application No. 2006-262700 filed on Sep. 27, 2006 in Japan, the entire contents of which are incorporated herein by reference.

BACKGROUND OF THE INVENTION

1. Field of the Invention

The present invention relates to a semiconductor integrated circuit apparatus.

2. Related Art

There is a problem that variations among devices become larger as semiconductor devices become finer. If the variations become large, a circuit block which is very slow in operation appears with a certain probability. In circuit design conformed to delay time in worst case, it becomes difficult to quicken the clock frequency. Furthermore, large variations make estimation of delay times using simulation difficult and might cause a timing error due to a large delay which exceeds a predicted value. Furthermore, since the power supply voltage becomes low and the clock frequency becomes high because of device miniaturization and an increased degree of integration, the probability that a soft error will be caused by high energy particles is increasing.

As a conventional configuration of a flip-flop used to avoid the timing error or soft error, for example, a configuration described in U.S. Patent Application Publication No. 2004/0199821 is known. In this configuration, a different latch circuit is provided in parallel with a flip-flop on a pipeline. The latch circuit is used with a clock delayed a little from the system clock. Contents of data retained in the latch circuit and the flip-flop are compared with each other. If they are different from each other, an error is judged to be present and data correction is conducted.

In this method, however, there is a problem that the circuit area becomes large because another latch circuit is prepared and a comparison circuit for comparing data and a circuit for correcting data are used. There is also a problem that the power dissipation increases because the prepared latch circuit is brought into operation even if there are no errors.

A flip-flop configuration aiming at low power dissipation is disclosed in JP-A 2000-232339 (KOKAI) or JP-A 2004-56667 (KOKAI). Only when an input of a flip-flop is different from its output, an internal clock rises at rising timing of the clock. If the input is not different from the output, the internal clock does not rise. However, this configuration has no resistance against an unexpected error, because a decision is made only at the rising edge of the clock.

SUMMARY OF THE INVENTION

The present invention has been made in view of these circumstances, and an object thereof is to provide a flip-flop circuit capable of implementing the error correction function with a small area increase as far as possible and a pipeline system using such a flip-flop circuit.

A flip-flop circuit according to a first aspect of the present invention includes: a flip-flop configured to operate based on a rising edge or a falling edge of a first clock signal; a decision circuit configured to compare an input of the flip-flop with an output thereof and output a request signal when the input of the flip-flop is different from the output thereof; and a control circuit configured to receive a second clock signal from outside and generate the first clock signal and a confirmation signal, wherein when the request signal is sent from the decision circuit after the flip-flop has been activated, the control circuit inverts the first clock signal, sends the confirmation to the decision circuit, and makes the decision circuit cancel the request signal.

A pipeline system according to a second aspect of the present invention includes: a plurality of sets each including a flip-flop and a logic circuit connected in series, the flip-flop in at least one set being replaced with the flip-flop circuit according to the first aspect.

DETAILED DESCRIPTION OF THE INVENTION

Hereafter, embodiments of the present invention will be described with reference to the drawings. In each of actual circuit examples, one example among all circuit configurations logically transformed. It is apparent that the same function can also be implemented in other circuit configurations which are not shown here.

First Embodiment

Figure 1:
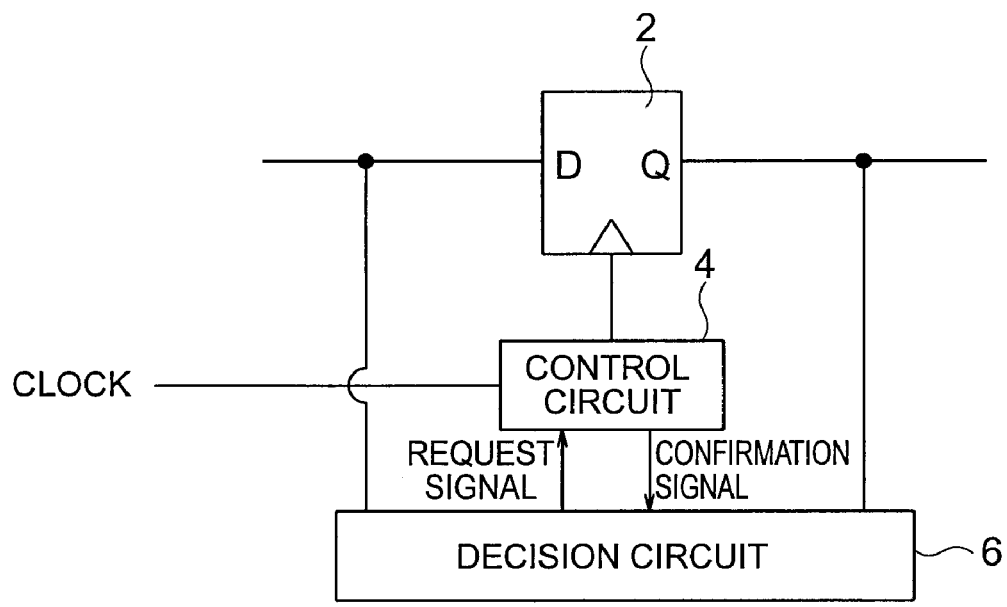
FIG. 1 is a block diagram showing a basic configuration of a flip-flop circuit according to a first embodiment.

A basic configuration of a flip-flop circuit according to a first embodiment of the present invention is shown in FIG. 1.

There are flip-flop circuits which are activated at a rising edge of the clock and flip-flop circuits which are activated at a falling edge of the clock. However, the ensuing embodiments will be described supposing that all flip-flop circuits operate at a rising edge. The case where the flip-flop circuit operates at a falling edge can also be considered in the same way. In the ensuing description, a D-type flip-flop (hereafter referred to D-FF as well) is taken as an example. However, the embodiment can be applied to flip-flops using a clock, and the embodiment is not restricted to D-FFs.

A flip-flop circuit according to the present embodiment includes an ordinary D-FF 2, a control circuit 4, and a decision circuit 6. The control circuit 4 is activated on the basis of a clock signal and a request signal supplied from the decision circuit 6 to send a confirmation signal to the decision circuit 6 and send a clock signal to the D-FF 2. The decision circuit 6 is activated on the basis of an input D and an output Q of the D-FF 2 and the confirmation signal sent from the control circuit 4 to send the request signal to the decision circuit 6.

It is supposed that neither the request signal from the decision circuit 6 nor the confirmation signal from the control circuit 4 is output in the initial state. First, the decision circuit 6 compares the input D of the flip-flop 2 with the output Q thereof. If the input D is different in value from the output Q, the decision circuit 6 sends the request signal to the control circuit 4. If timing of the request signal is after rising of the clock, the control circuit 4 lowers the clock and sends the confirmation signal to the decision circuit 6. Upon receiving the confirmation signal, the decision circuit 6 cancels the request signal. If the request signal is canceled, the control circuit 4 cancels the lowered state of the clock and cancels the confirmation signal. Since the clock canceled with respect to the lowered state rises again, its edge holds the input of the D-FF 2 again.

If in this operation the state D≠Q is present immediately after the clock has risen, an error is judged to be present. "Immediately after the clock has risen" is supposed to be when the clock is in the state of "H." In other words, even if the request signal is sent when the clock is in the state of "L," the confirmation signal is not issued and the above-described operation does not occur.

The request signal and the confirmation signal may be either of the positive logic and negative logic, as long as consistency is obtained in the control circuit 4 and the decision circuit 6.

If the above-described operation is conducted when a timing error has occurred or when a soft error has occurred, the clock rises twice for the D-FF 2 and the value is retained by the later clock. Viewing the whole system at that time, the clock in that part rises after a delay and the timing in a subsequent circuit becomes stringent. Although the clock timing is designed in the worst case, however, calculation in the worst case in which the logic passes through a critical path is not always conducted. Furthermore, it is also possible that a circuit in a certain part becomes very fast in operation because of variations of elements. Even if timing in a part becomes stringent, therefore, it is possible to absorb the timing somewhere in the subsequent circuit.

According to the present embodiment, the error correction function can be added by providing the control circuit 4 and the decision circuit 6 with only a small area increase as far as possible as heretofore described.

Second Embodiment

Figure 2:
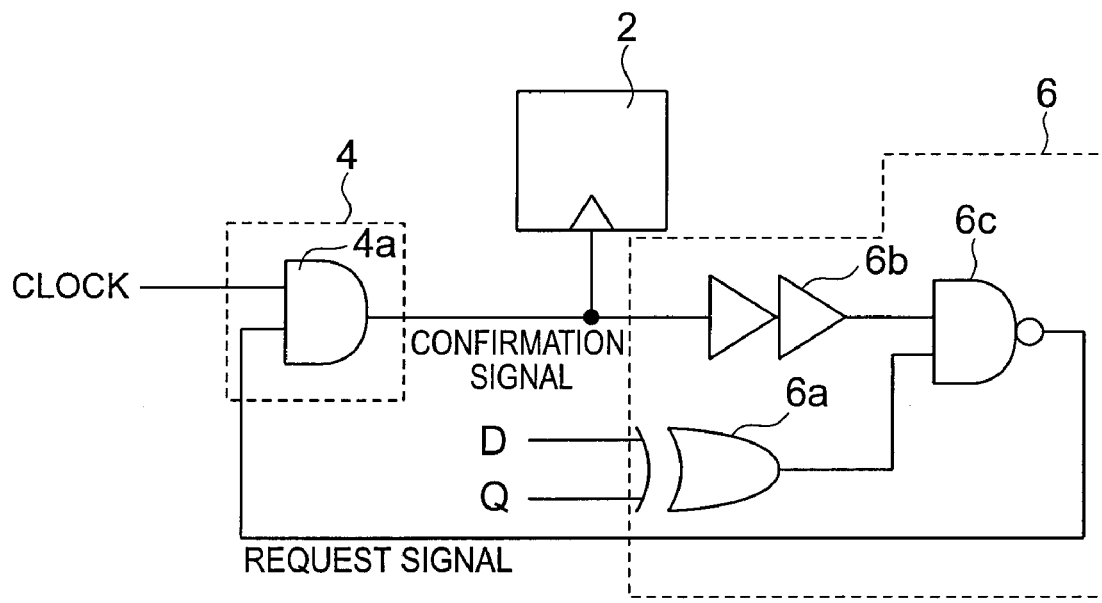
FIG. 2 is a circuit diagram showing a flip-flop circuit according to a second embodiment.

A flip-flop circuit according to a second embodiment of the present invention is shown in FIG. 2. The present embodiment is a circuit configuration in which the control circuit 4 and the decision circuit 6 in the flip-flop circuit according to the first embodiment are depicted concretely at the logic level. The control circuit 4 includes an AND circuit 4a. The decision circuit 6 includes an exclusive OR circuit 6a (hereafter also referred to as EXOR circuit 6a) which performs an exclusive OR operation on the basis of the input D and the output Q of the D-FF 2, a delay element 6b, and a logic circuit 6c which performs a NAND operation on the basis of outputs of the EXOR circuit 6a and the delay element 6b. In this case, the same signal is used as the clock supplied to the D-FF 2 and the confirmation signal. It holds true in some cases and it does not hold true in other cases, depending upon the logic to be synthesized. In the present embodiment, the request signal and the confirmation signal are represented by the negative logic.

The delay element 6b is inserted to absorb the clock-output delay time of the D-FF 2. In other words, there is a delay time in the D-FF 2 between the clock input and the output change. Because of this delay, therefore, there is a time period over which the relation D≠Q is satisfied immediately after the rising edge of the clock even if there are no errors. Since this state is not an error, this time period is absorbed by the delay element 6b. In this meaning, it is not always necessary to insert the delay element 6b in the position of the confirmation signal shown in FIG. 2, but the delay element 6b may be inserted at a node of the request signal between the logic circuit 6c and the AND circuit 4a. As for the method for implementing the delay element 6b, it can be implemented by using, for example, CMOS inverters repetitively. Furthermore, a delay time substantially similar to that obtained by inserting the delay element can also be inserted by changing sizes of preceding and subsequent logic gates and thereby controlling delays of the logic gates themselves without inserting the delay time explicitly in the form of the delay element 6b. As for the adjustment of the delay time, a plurality of CMOS inverters may also be used, or the adjustment of the delay time can be implemented by changing sizes of transistors included in CMOS inverters and narrowing channel widths or lengthening channel lengths, or combining the transistors with capacitors.

According to the present embodiment, the error correction function can be added by providing the control circuit 4 and the decision circuit 6 with only a small area increase as far as possible as heretofore described.

Third Embodiment

Figure 3:
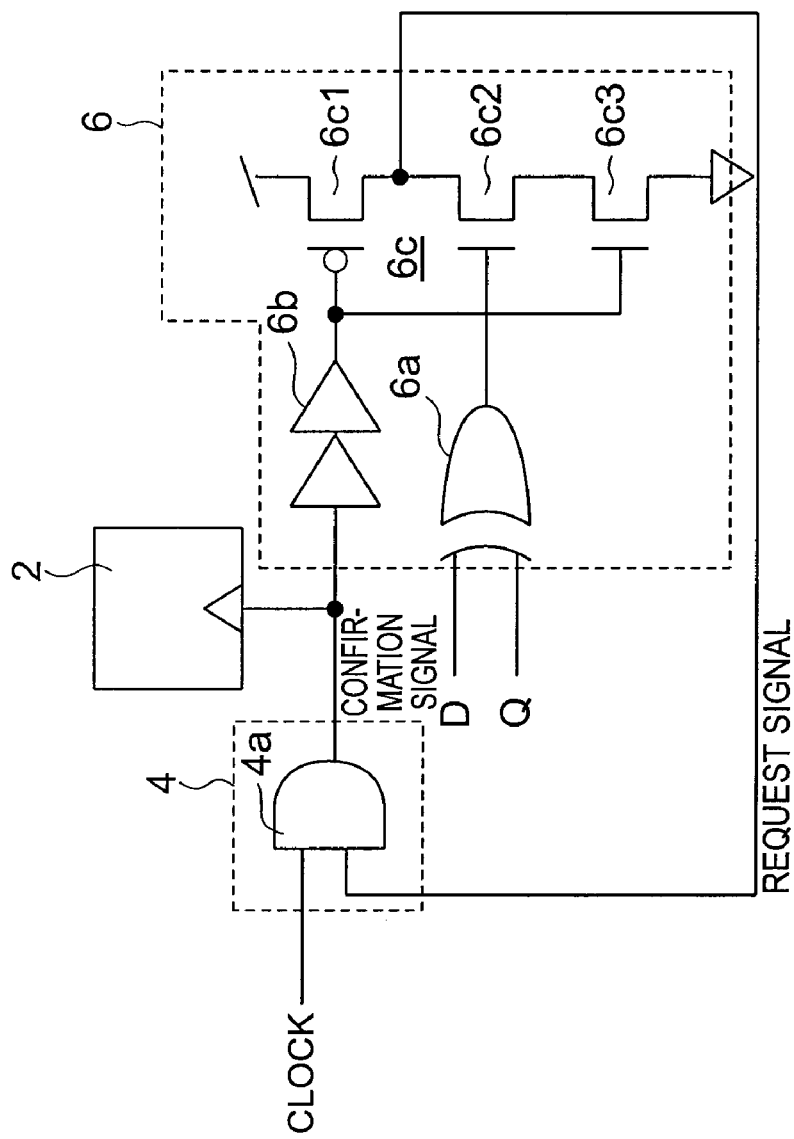
FIG. 3 is a circuit diagram showing a flip-flop circuit according to a third embodiment.

A flip-flop circuit according to a third embodiment of the present invention is shown in FIG. 3. The flip-flop circuit according to this embodiment has a configuration obtained by replacing the logic circuit 6c in the second embodiment with a p-channel transistor 6c1, an n-channel transistor 6c2 and an n-channel transistor 6c3.

When the clock is "L" in the case of a rising edge flip-flop, the control circuit 4 conducts nothing whatever request signal is sent from the decision circuit 6. Therefore, the decision circuit 6 needs only to operate properly only when the clock is "H." As a result, a dynamic circuit configuration as shown in FIG. 3 becomes possible.

Figure 4:
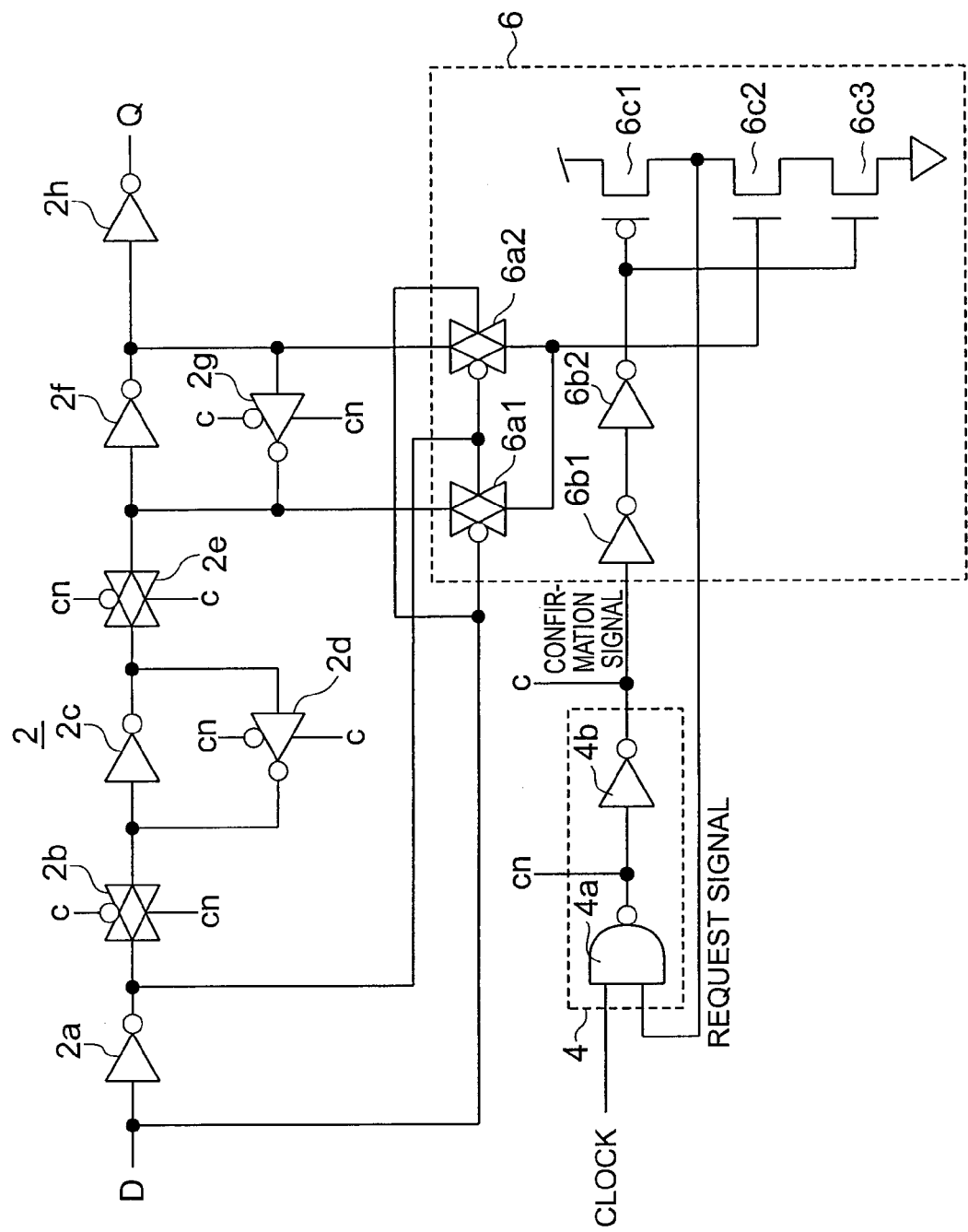
FIG. 4 is a circuit diagram showing a flip-flop circuit according to a first modification of the third embodiment.

A flip-flop circuit according to a first modification of the present embodiment is shown in FIG. 4. The first modification is an example of a flip-flop circuit obtained by depicting the configuration of the flip-flop circuit shown in FIG. 3 inclusive of the D-FF 2 at the logic level. The D-FF 2 includes an inverter 2a, a transfer gate 2b, a latch circuit including an inverter 2c and a clocked inverter 2d cross connected, a transfer gate 2e, a latch circuit including an inverter 2f and a clocked inverter 2g cross connected, and an inverter 2h. They are connected in series.

The control circuit 4 includes a NAND circuit 4a and an inverter 4b which inverts an output of the NAND circuit 4a. The decision circuit 6 includes transfer gates 6a1 and 6a2 which operate on the basis of an input and an output of the inverter 2a, inverters 6b1 and 6b2, and a p-channel transistor 6c1 and n-channel transistors 6c2 and 6c3 connected in series. By the way, the transfer gate 2b operates on the basis of the output cn of the NAND circuit 4a and an inverted output of an output c of the inverter 4b. The transfer gate 2e operates on the basis of an inverted output of the output cn of the NAND circuit 4a and the output c of the inverter 4b. The transfer gates 6a1 and 6a2 constitute an EXOR circuit 6a shown in FIG. 3.

If the circuit configuration as in the present modification is adopted, the number of transistors added to the original D-FF 2 is only 17. On the other hand, if the circuit configuration described in the U.S. Patent Application Publication No. 2004/0199821 is used, the number of added transistors becomes approximately 38 because of the additional latch circuit, comparison circuit, and selector circuit. According to the present modification, therefore, it becomes possible to implement the error correction function while holding down the circuit overhead to a small value.

Figure 5:
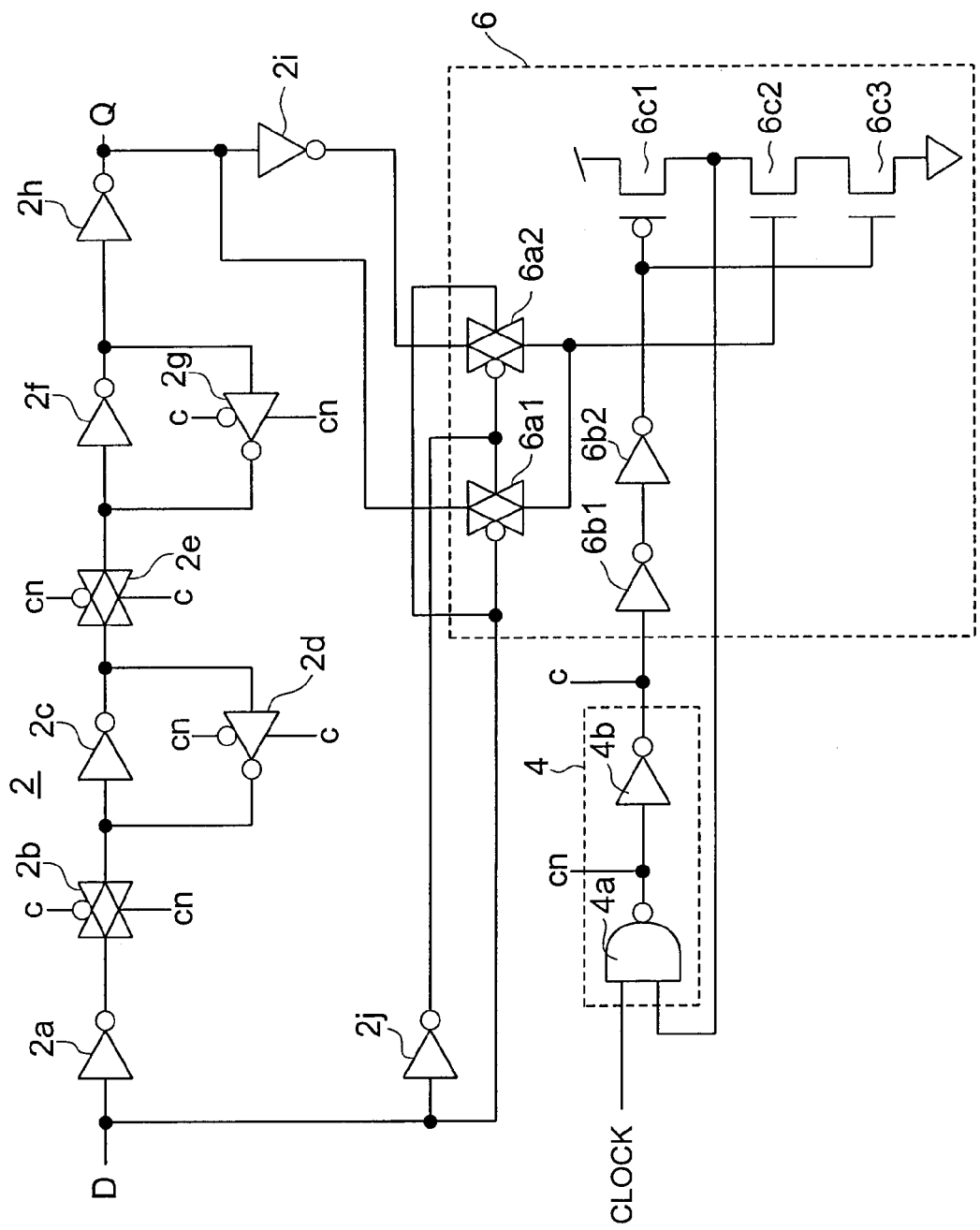
FIG. 5 is a circuit diagram showing a flip-flop circuit according to a second modification of the third embodiment.

In the present modification, the transfer gate 6a1 receives an input of the inverter 2f and the transfer gate 6a2 receives an output of the inverter 2f. Alternatively, it is also possible that the transfer gate 6a1 receives an output of the inverter 2h and the transfer gate 6a2 receives an output of an inverter 2i which inverts the output of the inverter 2h as in a second modification shown in FIG. 5. In this case, the transfer gates 6a1 and 6a2 operate on the basis of an input of the inverter 2a and an output of an inverter 2j which inverts the input.

Figure 6:
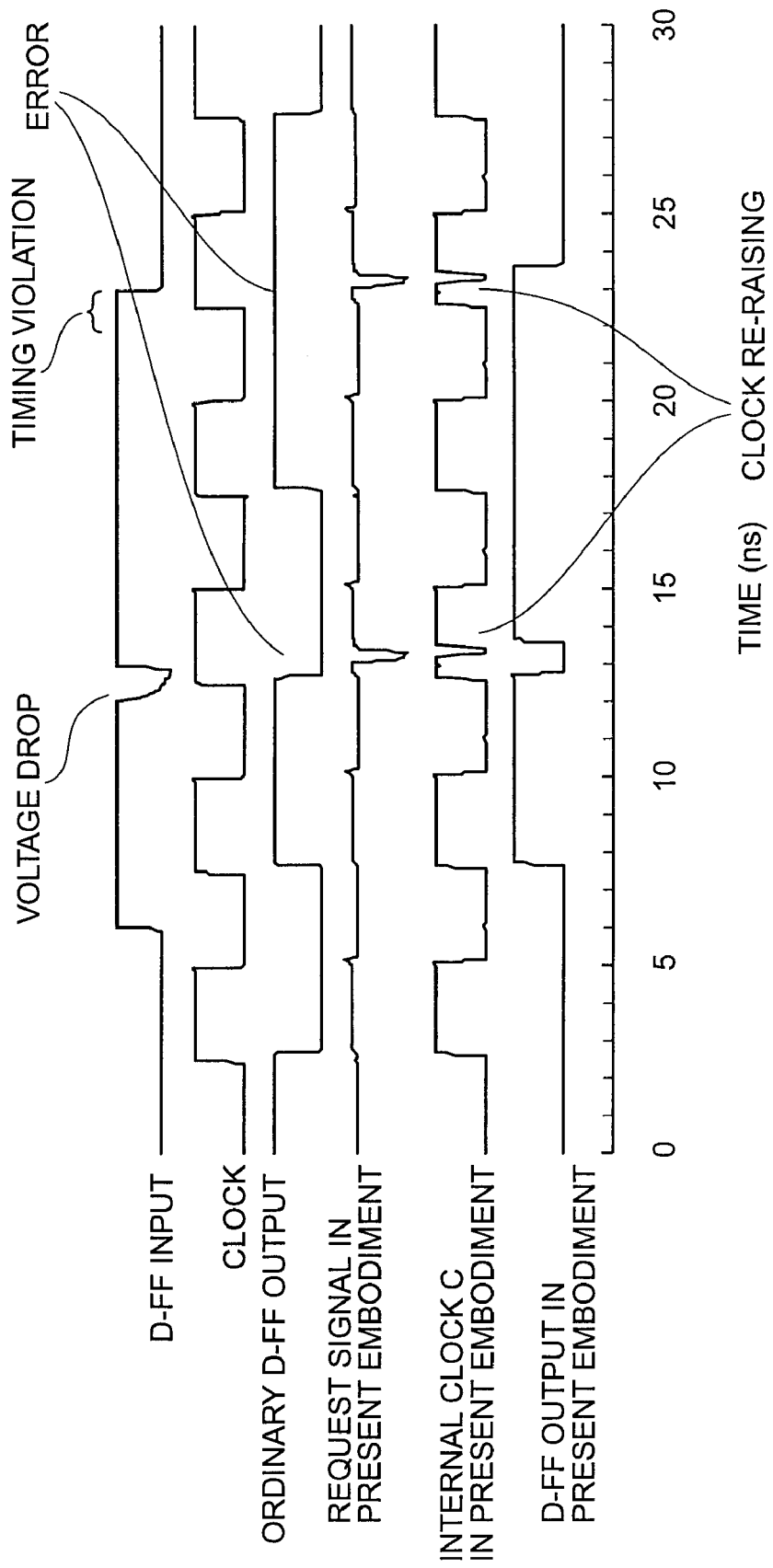
FIG. 6 is a signal waveform diagram showing operation in the third embodiment.

Signal waveforms of the flip-flop circuit in the present embodiment are shown in FIG. 6. In a state in which an input signal D of the D-FF 2 is in ordinary operation, there is no difference in operation between the D-FF 2 in the present embodiment and the ordinary D-FF. For example, if a transient error (here, a voltage drop) is caused by high energy particles and the clock rises at that timing, the ordinary D-FF with no countermeasures taken holds erroneous data. In the D-FF 2 according to the present embodiment, the clock is raised again after data recovery and correct data can be sent out to a subsequent stage, although some delay is caused. For example, it is now supposed that the logic timing becomes erroneous, resulting in a timing error. If in this case as well a correct value is restored immediately after rising of the clock, it is also possible to raise the clock again and send out correct data to a subsequent stage. The average current which has flown through the current in this operation example is approximately 0.047 mA according to simulation. In the configuration of the U.S. Patent Application Publication No. 2004/0199821, however, the average current is approximately 0.069 mA. Thus, it becomes possible for the flip-flop circuit according to the present embodiment to implement the error correction function with low power dissipation.

Immediately after the rising means a time period over which the clock is at the "H" level. When the duty ratio of the clock is approximately 50%, the time period over which the clock is at the "H" level is often too long. In that case, it can be coped with by changing the duty ratio of the clock and shortening the time period over which the clock is at the "H" level. Furthermore, if it is difficult to adjust the duty ratio of the clock, it is possible to use the signal from outside which represent the error correction time. For example, the controller 4 can use the signal which is performed the AND operation on the basis of the clock and the signal from outside whose "H" level is shortened to error correction period. Furthermore, the controller 4 can use the signal which is performed the AND operation on the basis of the clock and the inverted signal from the output whose timing is delayed for error correction time. Furthermore, this is also possible in a fourth embodiment which will be described now.

Fourth Embodiment

Figure 7:
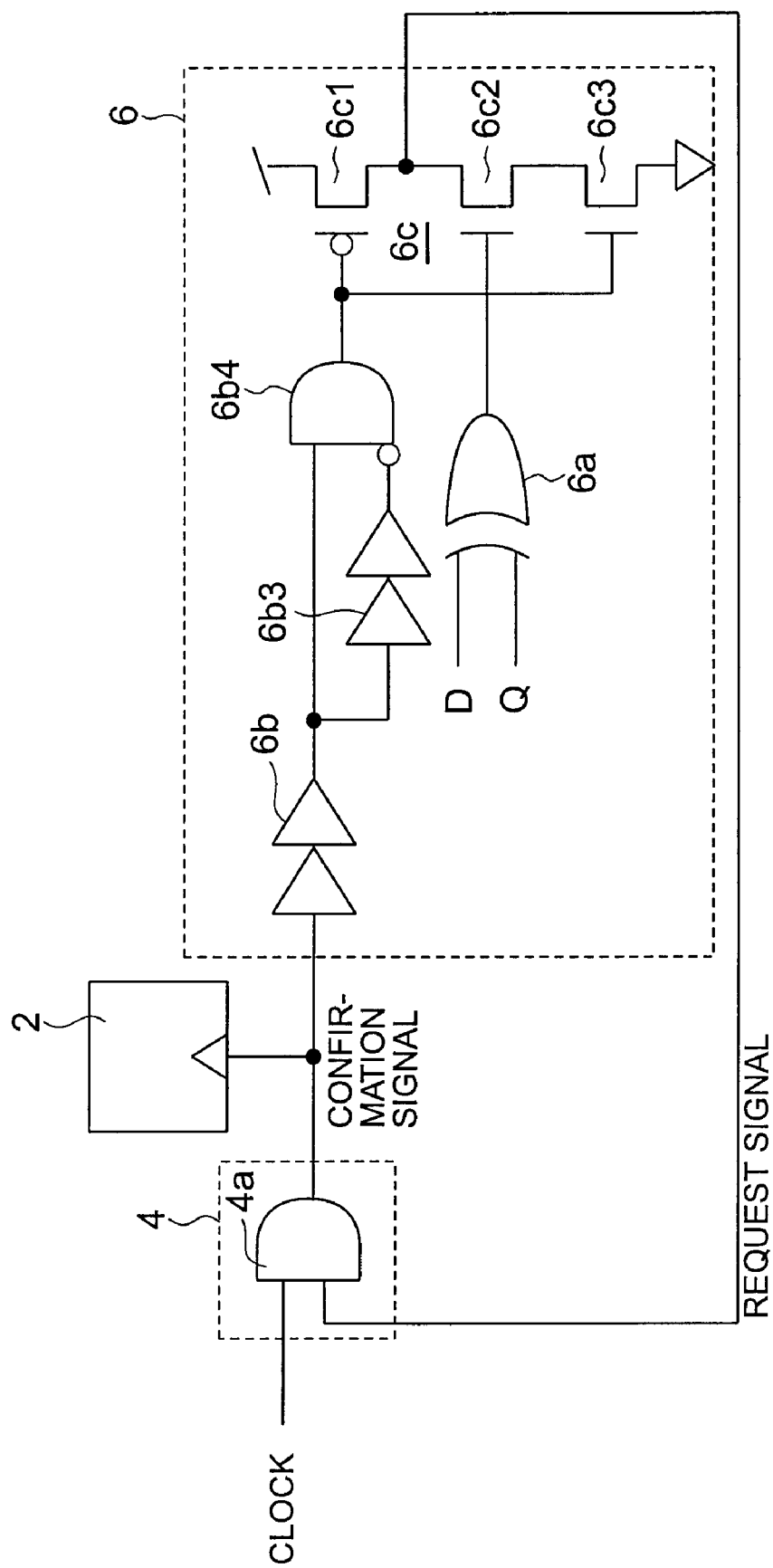
FIG. 7 is a circuit diagram showing a flip-flop circuit according to a fourth embodiment.

A flip-flop circuit according to a fourth embodiment of the present invention is shown in FIG. 7. The flip-flop circuit according to the present embodiment has a configuration obtained by inserting a delay element 6b3 and an AND circuit 6b4 after the delay element 6b in the third embodiment shown in FIG. 3. Only one of logics of the AND circuit 6b4 is made to perform a negative logic operation. If at this time two inputs become "H," the AND circuit 6b4 outputs "L." Since the delay element is inserted in only one input, however, the AND circuit 6b4 outputs "H" over a time period of a delay difference between the inputs after the clock has changed from "L" to "H." Only over the time period, the error decision of the D-FF 2 is conducted. The time period is determined by the delay difference caused between the two inputs of the AND circuit 6b4 by the delay element 6b3. The delay time adjustment can be implemented by connecting inverters, changing the channel width or channel length, or combining inverters with capacitors, in the same way as other embodiments. The AND circuit using the negative logic on one side can be implemented by connecting inverters to an input of the AND circuit. Even if such a configuration is adopted, the number of added transistors is approximately 27. Thus, it becomes possible to provide the error correction function while holding down the circuit overhead to a small value.

According to the present embodiment as well, the error correction function can be implemented with only a small area increase as far as possible, in the same way as the third embodiment.

Fifth Embodiment

Figure 8:
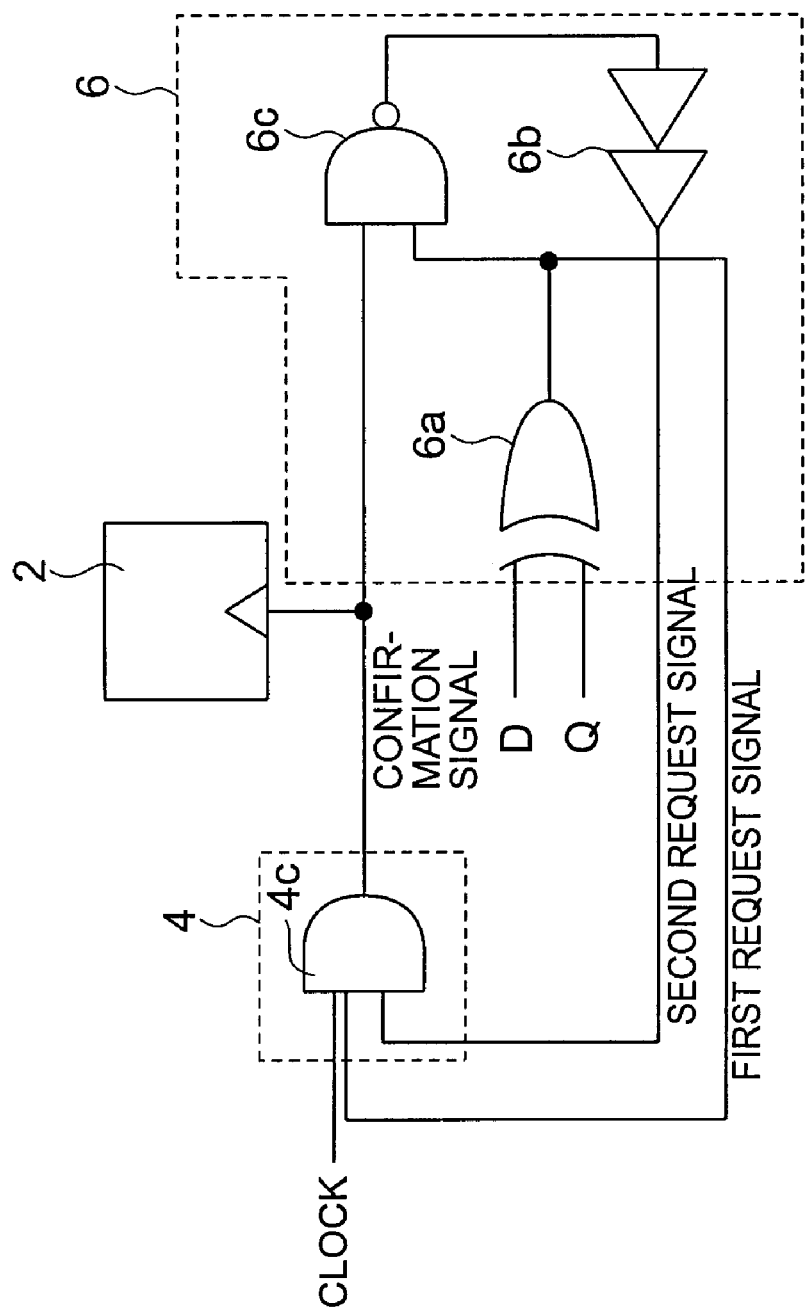
FIG. 8 is a circuit diagram showing a flip-flop circuit according to a fifth embodiment.

A flip-flop circuit according to a fifth embodiment of the present invention is shown in FIG. 8. The flip-flop circuit according to this embodiment has a configuration obtained from the second embodiment shown in FIG. 2 by forming the control circuit 4 of a 3-input AND circuit 4c, inputting an output of the EXOR circuit 6a to the 3-input AND circuit 4c as a first request signal, providing the delay element 6b in the decision circuit 6 between the output of the logic circuit 6c and an input of the 3-input AND circuit 4c, and inputting an output of the delay element 6b to the 3-input AND circuit 4c as a second request signal.

In other words, as for the request signal to the control circuit 4, a signal (the first request signal) which outputs the D≠Q signal in the decision circuit is output in addition as the request signal. More specifically, the output of the exclusive OR circuit 6a in the decision circuit 6 is input to the 3-input AND circuit 4c in the control circuit 4 as the positive logic. In such a configuration, the control circuit 4 exercises control to input the clock to the D-FF 2 only when the D-FF 2 needs the clock. In other words, the clock is input to the D-FF 2 when D≠Q and the clock has risen and when an error has been detected thereafter. The delay element 6b is connected to the output of the logic circuit 6c and a node of the request signal. As a matter of course, however, it is also possible to connect the delay element 6b to the node of the confirmation signal, and it does not matter where the position is.

In the present embodiment as well, the error correction function can be implemented with a small area increase as far as possible.

Figure 9:
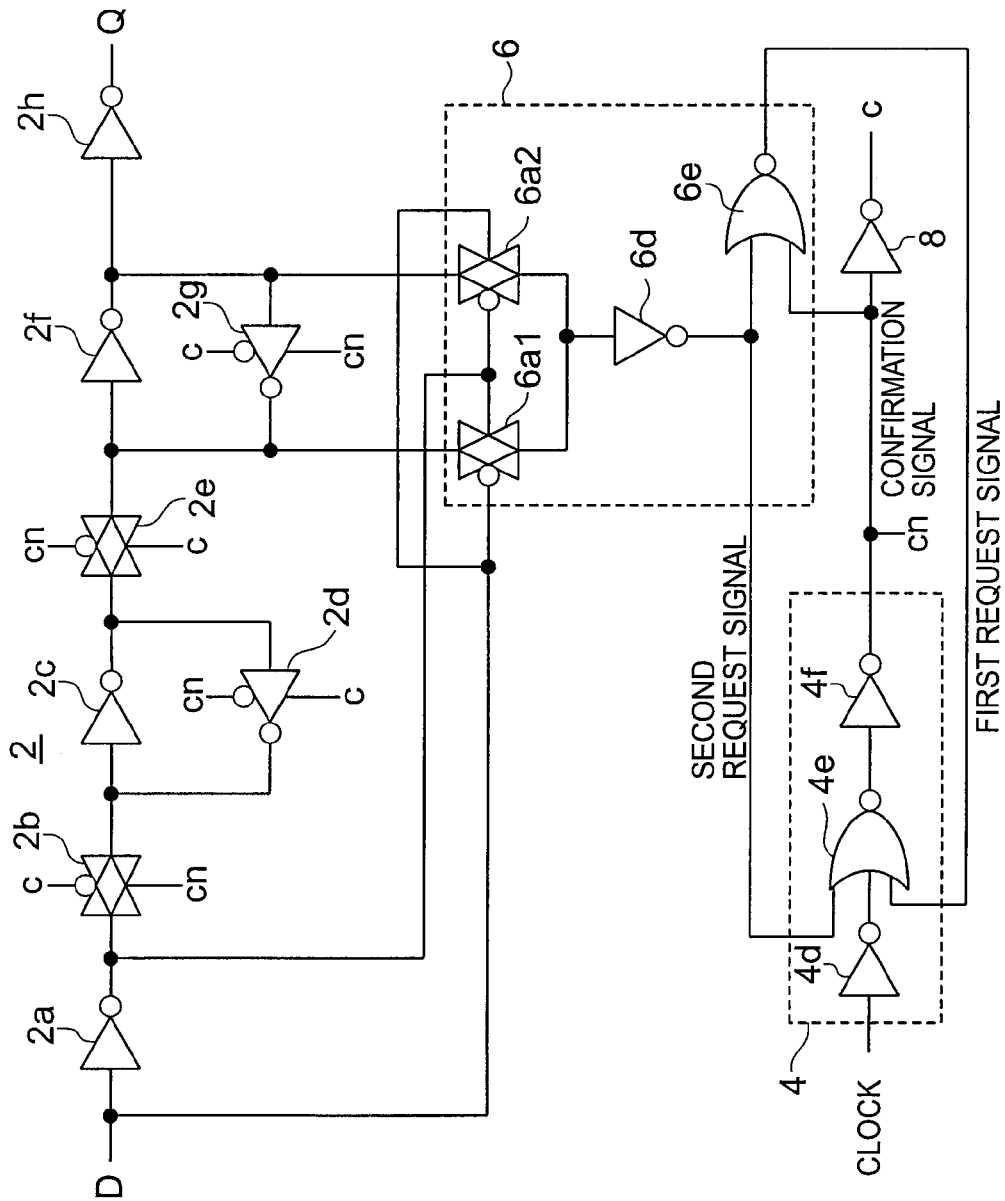
FIG. 9 is a circuit diagram showing a flip-flop circuit according to a first modification of the fifth embodiment.

A flip-flop circuit according to a first modification of the present embodiment is shown in FIG. 9. This modification is an example in which the configuration of the fifth embodiment shown in FIG. 8 is depicted concretely at the logic gate level. Logic gates are changed from the logic of the NAND circuit 4c, the logic circuit 6c and the AND circuit shown in FIG. 8 to the logic of NOR circuits. They are changes in optimizing the number of logic gates and operation, and there are no logical changes at all. The D-FF 2 has the same configuration as the D-FF 2 shown in FIG. 4. The control circuit 4 includes an inverter 4d, a 3-input NOR circuit 4e, and an inverter 4f. They are connected in series. The decision circuit 6 includes transfer gates 6a1 and 6a2, an inverter 6d, and a NOR circuit 6e. The delay element 6b depicted in the fifth embodiment shown in FIG. 8 is not used in the present modification. This is because a necessary delay time is secured by adjusting the preceding and subsequent logics and the logic gate size. The inverter 6d receives outputs of the transfer gates 6a1 and 6a2. The inverter 4d inverts an clock input from the outside. The NOR circuit 4e receives an output of the inverter 4d, an output (second request signal) of the inverter 6d, and an output (first request signal) of the NOR circuit 6e to perform NOR operation on them. The inverter 4f inverts an output of the NOR circuit 4e. The NOR circuit 6e receives an output (confirmation signal) of the inverter 4f and the output of the inverter 6d to perform NOR operation on them. The output signal of the inverter 4f is used as a clock signal cn of the D-FF 2, and an output signal of an inverter 8 is used as a clock signal c.

As a matter of course, countless configuration methods are possible in the circuit configuration depicted in the present modification without changing the logic, besides the fifth embodiment shown in FIG. 8. Even if such a circuit configuration is adopted, the number of transistors added to implement the error correction function is approximately 20. It is thus possible to implement the error correction function while holding down the circuit overhead to a small value.

Figure 10:
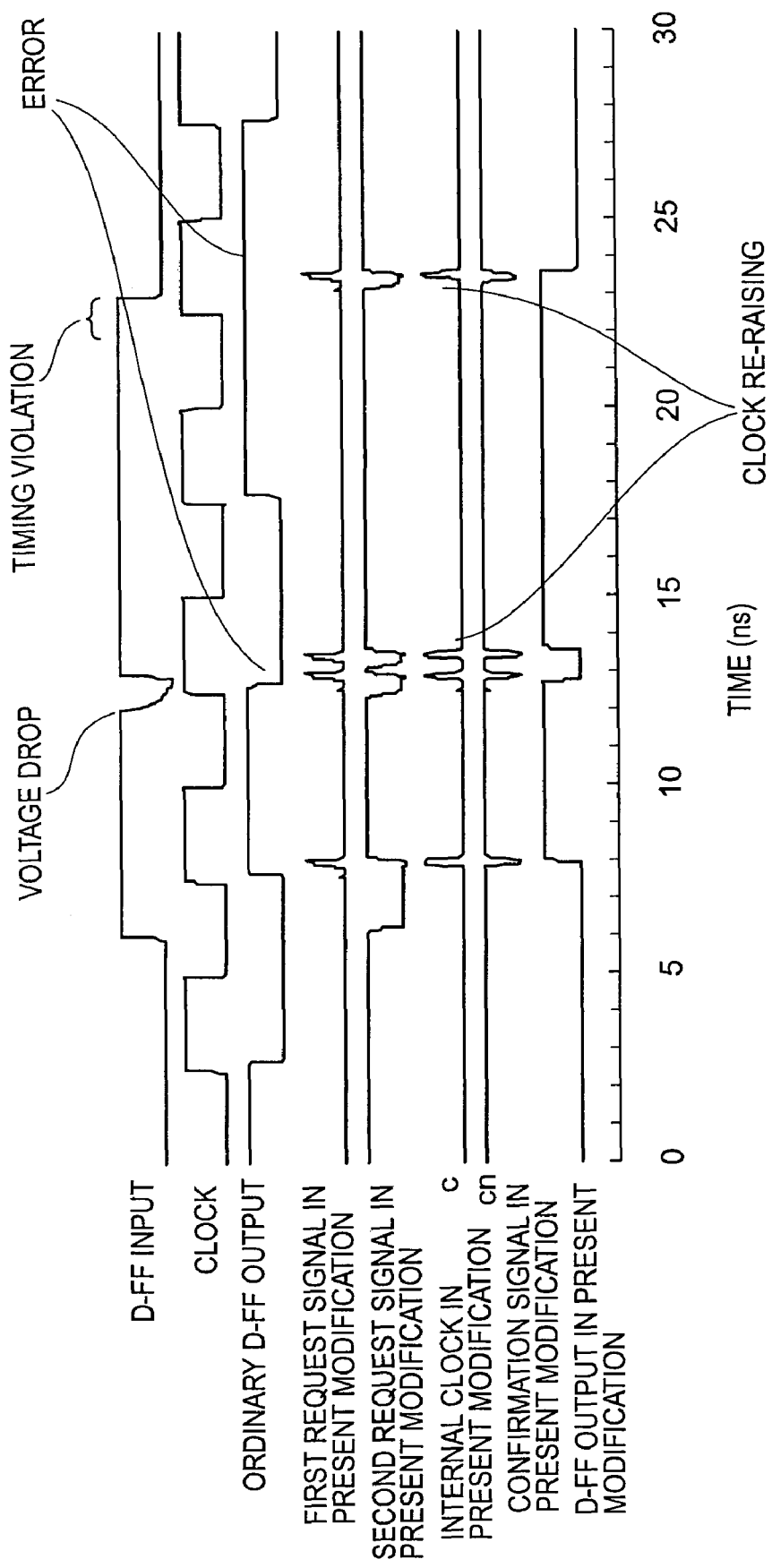
FIG. 10 is a signal waveform diagram showing operation of a flip-flop circuit according to the first modification of the fifth embodiment.

FIG. 10 is a signal waveform diagram showing circuit operation of the configuration of the D-FF 2 in the present modification shown in FIG. 9. In the same way as FIG. 6, the voltage effect brought about by high energy particles and operation conducted when timing violation is caused by a delay are exhibited. According to the present modification, the internal clocks c and cn do not rise when D=Q regardless of whether there is an error or not. When D≠Q, the internal clocks c and cn rise at rise timing of the clock and data is retained in the D-FF 2. Even if an error has occurred, the clock rises at that time point and a correct value can be retained although some delay is involved. The average current value according to simulation at this time is approximately 0.048 mA. It is thus possible to implement the error correction function with lower power dissipation as compared with the U.S. Patent Application Publication No. 2004/0199821. By the way, the power dissipation is not made lower as compared with the modification of the third embodiment shown in FIG. 4. In the present embodiment, however, low power dissipation is implemented by excluding extra circuit operation when transitions of data input to the D-FF 2 are few. If data transitions are many as in the present simulation, therefore, not so a great effect is not obtained. On the contrary, if data transitions are few, extra circuit operations are excluded and consequently a greater power dissipation reduction effect is obtained.

Figure 11:
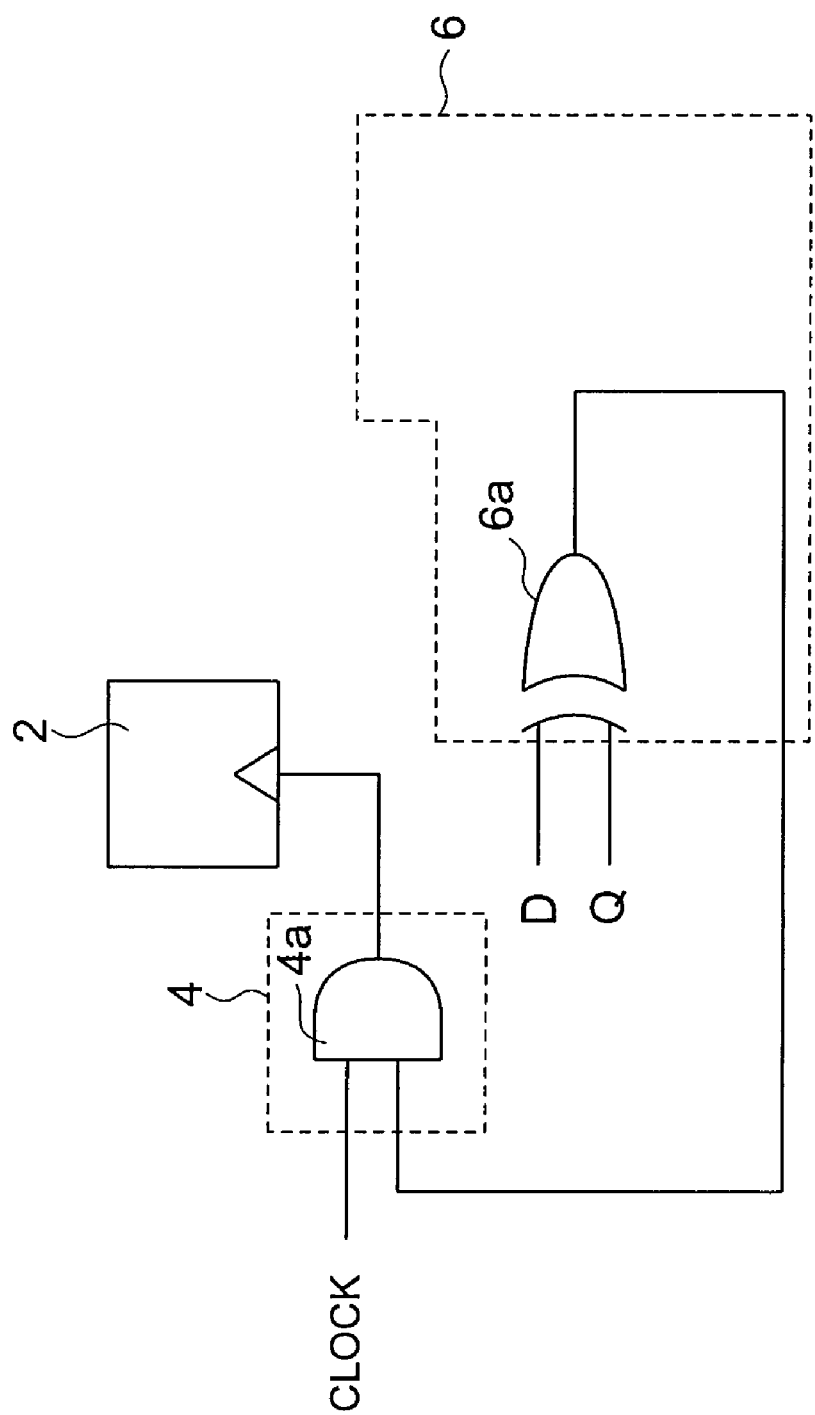
FIG. 11 is a circuit diagram showing a flip-flop circuit according to a second modification of the fifth embodiment.

A part of the configuration which raises the clock only when an error has occurred and D≠Q can also be implemented by using a configuration such as a flip-flop circuit according to a second modification shown in FIG. 11. In this modification, the decision circuit 6 including an EXOR circuit 6a does not receive the confirmation signal from the control circuit including an AND circuit 4a, and the decision circuit 6 requests only information of D≠Q from the control circuit 4. This results in an advantage that the needed circuit scale is small. However, there is no confirmation signal. If D≠Q is not canceled by some error although the clock is raised, therefore, the D-FF 2 continues the operation without knowing it. This results in a drawback of lowered error resistance.

Sixth Embodiment

Figure 12:
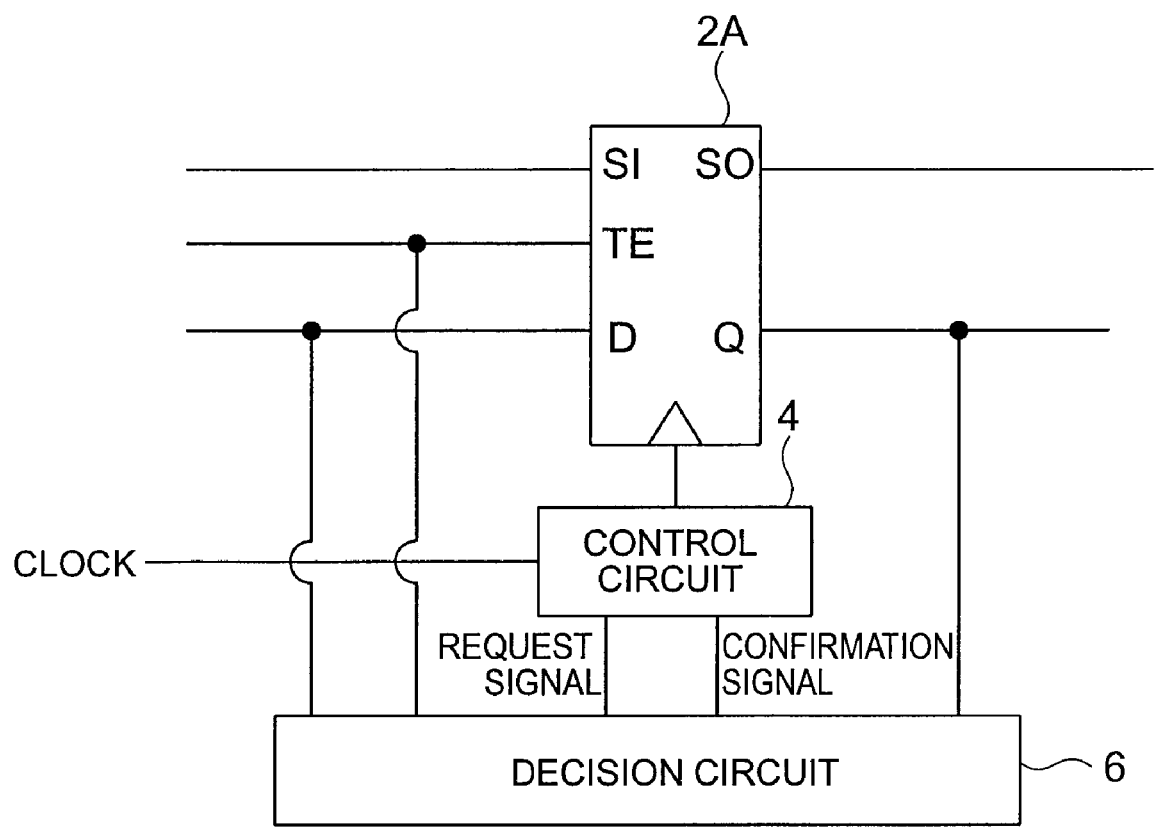
FIG. 12 is a circuit diagram showing a flip-flop circuit according to a sixth embodiment.

A flip-flop circuit according to a sixth embodiment of the present invention is shown in FIG. 12. The flip-flop circuit according to the present embodiment has a configuration obtained by replacing the D-FF 2 in the first embodiment shown in FIG. 1 with a flip-flop 2A. The flip-flop 2A has a configuration obtained by providing the D-FF 2 in the first embodiment with a terminal for receiving a test mode signal TE, a terminal for receiving a test mode input signal SI, and a terminal for receiving a test mode output signal SO.

There is a case where data is input directly to the flip-flop from the outside such as when a scan test is conducted. At that time, it becomes possible to implement shift register operation by inputting the test mode signal TE and coupling the terminal for the input signal SI in a flip-flop circuit of a stage in a pipeline system to the terminal for the output signal in a flip-flop circuit of a preceding stage. At that time, the test mode signal TE is input to the decision circuit 6 as well to stop the operation of the decision circuit 6 temporarily. As a matter of course, the present configuration can be used not only in the test mode but also in the ordinary use if necessary.

In the present embodiment as well, the error correction function can be implemented with a small area increase as far as possible.

Figure 13:
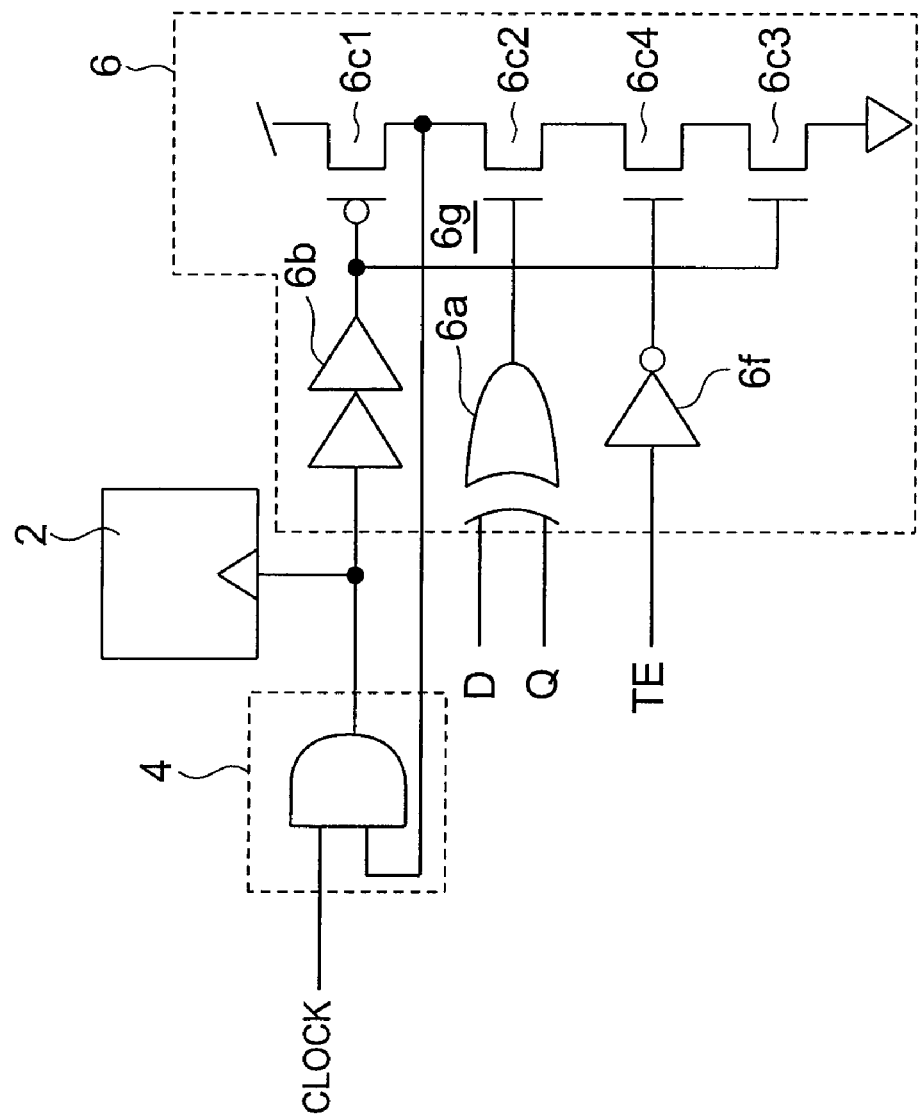
FIG. 13 is a circuit diagram showing a flip-flop circuit according to a first modification of the sixth embodiment.

A flip-flop circuit according to a first modification of the present embodiment is shown in FIG. 13. The present modification is obtained by depicting the configuration of the sixth embodiment shown in FIG. 12 at the gate level. The present modification has a configuration using a logic circuit 6 obtained from the configuration of the third embodiment shown in FIG. 3 by newly providing an inverter 6f to receive the test mode signal TE and providing an n-channel transistor 6c4 in the logic circuit 6c to receive an output of the inverter 6f. The n-channel transistor 6c4 is provided between the n-channel transistors 6c2 and 6c3. When the test mode signal TE is turned on, the request signal is prevented from being output from the decision circuit 6 and the function of the decision circuit 6 is temporarily stopped. If the test mode signal TE is the negative logic, the inverter 6f which receives the test mode signal TE can be removed and the circuit area can be reduced.

Figure 14:
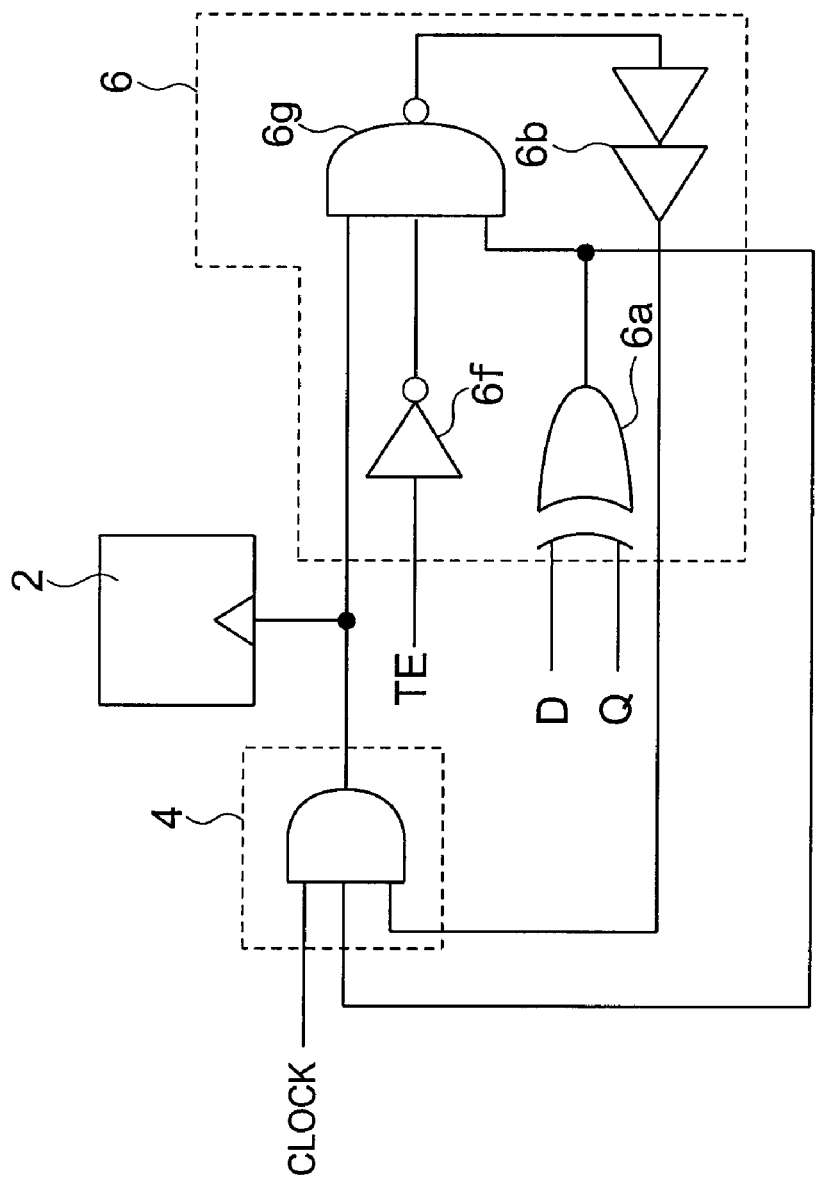
FIG. 14 is a circuit diagram showing a flip-flop circuit according to a second modification of the sixth embodiment.

A flip-flop circuit according to a second modification of the present embodiment is shown in FIG. 14. The flip-flop circuit in this modification has a configuration obtained from the flip-flop circuit according to the fifth embodiment shown in FIG. 8 by newly providing an inverter 6f to receive the test mode signal TE and replacing the 2-input logic circuit 6c with a 3-input logic circuit 6g which performs NAND operation, to receive an output of the inverter 6f. When the test mode signal TE is turned on, the request signal is prevented from being output from the decision circuit 6 and the function of the decision circuit 6 is temporarily stopped. If the test mode signal TE is the negative logic, the inverter 6f which receives the test mode signal TE can be removed and the circuit area can be reduced.

Seventh Embodiment

Figure 15:
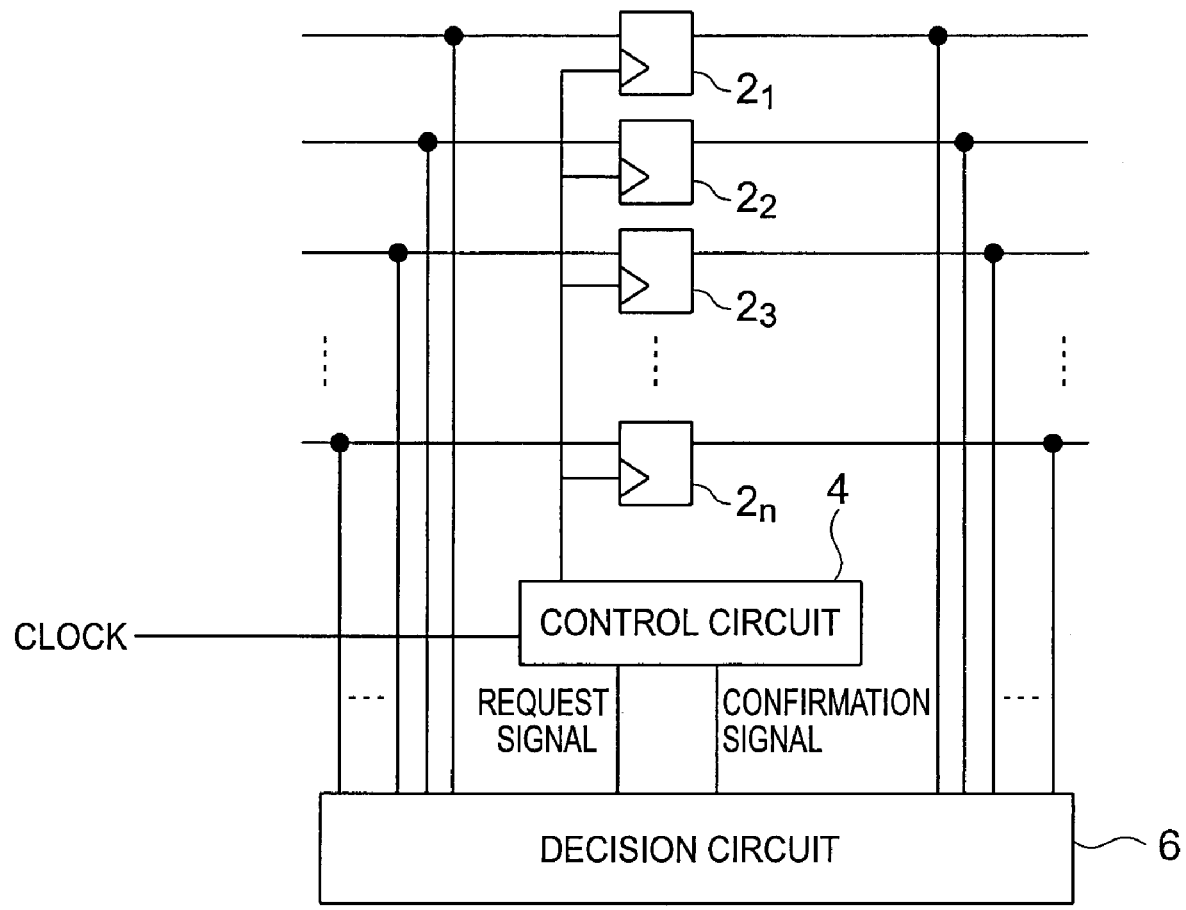
FIG. 15 is a circuit diagram showing a flip-flop circuit according to a seventh embodiment.

A flip-flop circuit according to a seventh embodiment of the present invention is shown in FIG. 15. The flip-flop circuit according to the present embodiment has a configuration in which a plurality of D-FFs $2_1, 2_2, \ldots, 2_n$ ($n \geq 2$) are included and the decision circuit 6 and the control circuit 4 are shared by the D-FFs $2_1, 2_2, \ldots, 2_n$. Although the area of the decision circuit 6 and the control circuit 4 increases, therefore, the area of the whole circuit is reduced. According to this configuration, a decision is made on an input and an output of each of the D-FFs $2_1, 2_2, \ldots, 2_n$. If even one error is detected, the whole clocks are raised again. As a result, resistance against errors can be provided.

Figure 16:
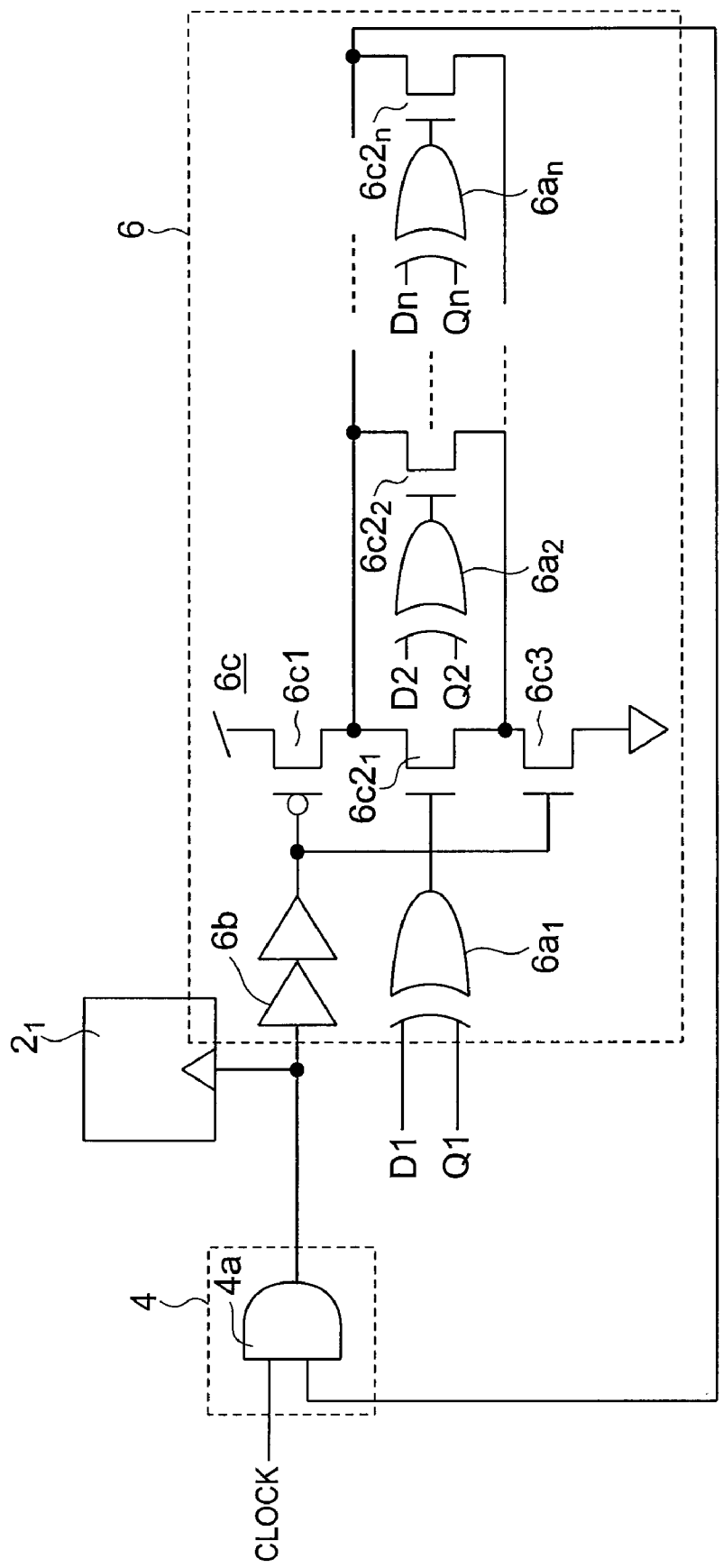
FIG. 16 is a circuit diagram showing a flip-flop circuit according to a first modification of the seventh embodiment.

A flip-flop circuit according to a first modification of the present embodiment is shown in FIG. 16. The flip-flop circuit according to this modification is an example in which the configuration of the seventh embodiment shown in FIG. 15 is depicted concretely at the gate level. By the way, in FIG. 16, only D-FF $2_1$ is depicted as the D-FF, and other D-FFs are omitted. In the present modification, a plurality of decision circuits (EXOR circuits) which make a decision whether the relation D≠Q is satisfied are connected to the configuration in the third embodiment shown in FIG. 3 in an OR configuration of domino circuits which are dynamic gates. In other words, sources and drains of n-channel transistors $6c2_i$ each receiving an output of an EXOR circuit $6ai$ which makes a decision whether the relation D≠Q is satisfied as to D-FF $2i$ ($i=1, \ldots, n$) are connected in common, respectively. If an error occurs in at least one of the D-FFs $2_1, 2_2, \ldots, 2_n$ in this configuration, it is possible to raise the clock again and execute data rereading. As a result, resistance against errors can be provided. The same is true of the case where static gates are used instead of the configuration of the domino circuits as in the present configuration. The same function can be implemented by OR-connecting a plurality of EXOR circuits.

Figure 17:
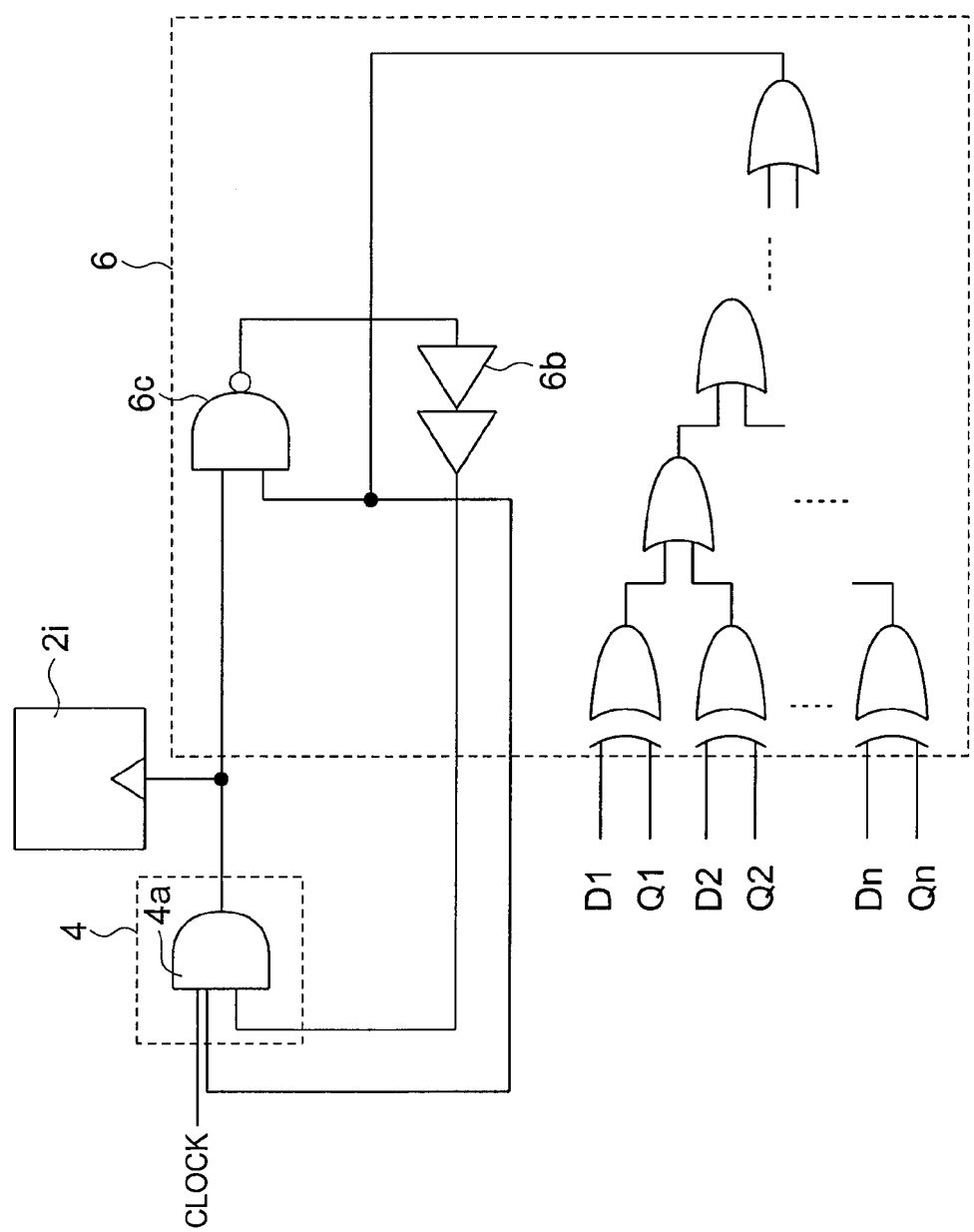
FIG. 17 is a circuit diagram showing a flip-flop circuit according to a second modification of the seventh embodiment.

When OR-connecting a plurality of D≠Q decision circuits, it is also possible to conduct connections divisionally. As a result, the operation speed can be improved as compared with the case where OR connections are conducted at a time. FIG. 17 is a circuit diagram showing a flip-flop circuit according to a second modification of the seventh embodiment obtained by applying this configuration based upon the configuration of the fifth embodiment shown in FIG. 8. It is apparent that the method of dividing the OR connections can also be applied in the same way when the configuration of the dynamic circuit is adopted.

Eighth Embodiment

Figure 18:
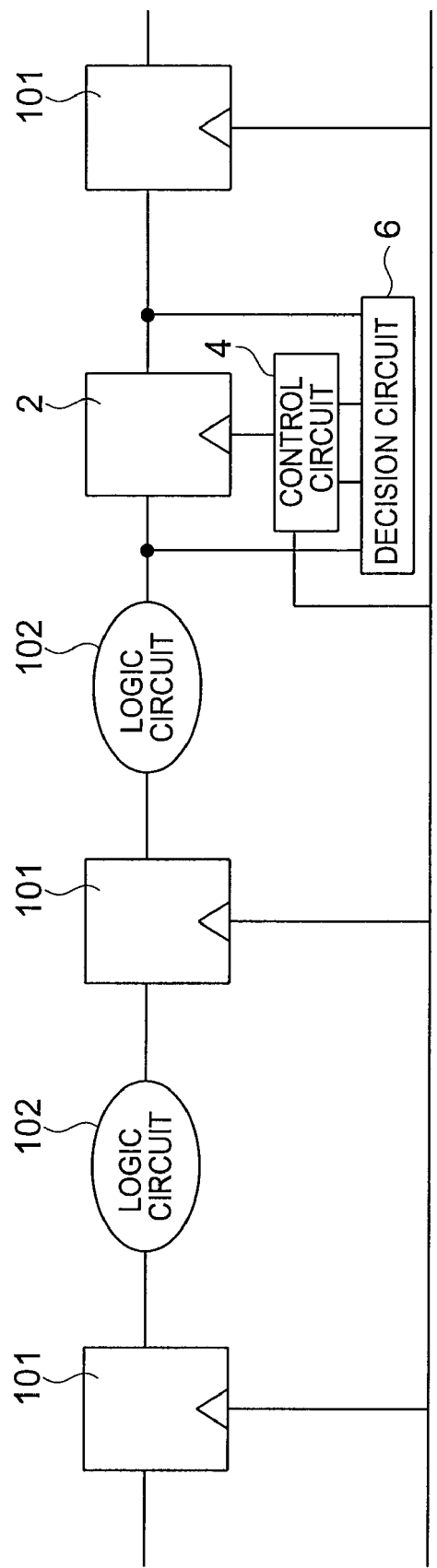
FIG. 18 is a block diagram showing a pipeline system according to an eighth embodiment.

A pipeline system according to an eighth embodiment of the present invention is shown in FIG. 18. The pipeline system according to the present embodiment has a configuration obtained from a pipeline including a plurality of sets of a D-FF 101 and a logic circuit 102 connected in series by replacing at least one D-FF 101 with the flip-flop circuit according to any of the first to seventh embodiments. It is possible to provide the whole circuit with error resistance by using such a pipeline configuration. All flip-flops may be replaced with the flip-flop circuits according to the embodiment. Or the flip-flop circuits according to the embodiment may be inserted only in places where the logic timing is stringent. By the way, in the configuration shown in FIG. 18, an empty stage which does not include a logic circuit is provided subsequent to the flip-flop circuit according to the present embodiment introduced into the pipeline.

When an error is avoided by the flip-flop circuit according to the embodiment, the logic subsequent to it becomes stringent in timing. Typically, calculation of the worst delay time is not conducted in all logics. Therefore, the delay time may be absorbed at some timing. However, it is not always true in all circuits. Accordingly, more positive error resistance can be implemented by preparing an empty stage. The empty stage may be located immediately after the flip-flop circuit, at the end of the whole pipeline, or anywhere as long as it is located after the flip-flop circuit in the embodiment.

In the embodiments heretofore described, the circuit configuration is not restricted to this. It is apparent that a circuit configuration having a similar effect can be formed by logical transformation. The flip-flop has been described supposing that it is rising edge trigger type. However, a flip-flop of falling edge trigger type can be considered in the same way. In that case, an optimum circuit configuration can be implemented by using a clock negative logic, inserting an inversion circuit, and conducting logical transformation.

According to the embodiments of the present invention, it becomes possible to implement a system having resistance against errors as heretofore described.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A flip-flop circuit comprising:
a flip-flop configured to operate based on a rising edge or a falling edge of a first clock signal;
a control circuit configured to receive a second clock signal from outside and generate the first clock signal; and
a decision circuit configured to operate based on the first clock signal, and an input and an output of the flip-flop, compare the input of the flip-flop with the output thereof, and output a request signal when the input of the flip-flop is different from the output thereof, and
wherein when the request signal is sent from the decision circuit after the flip-flop has been activated, the control circuit makes the first clock signal an inverted state, sends the first clock signal in the inverted state to the decision circuit, and makes the decision circuit cancel the request signal, and the control circuit cancels the inverted state of the first clock signal when the request signal is canceled.

2. The flip-flop circuit according to claim 1, wherein the control circuit comprises an AND circuit,
the decision circuit comprises a noncoincidence detection circuit which detects noncoincidence between the input and the output of the flip-flop, a delay element which delays an output of the AND circuit, and a logic circuit which performs NAND operation based on an output of the noncoincidence detection circuit and an output of the delay element, and outputs the request signal, and the AND circuit performs AND operation based on the second clock signal and an output of the logic circuit, and sends the first clock signal to the flip-flop and the delay element as an output.

3. The flip-flop circuit according to claim 1, wherein
the control circuit comprises an AND circuit,
the decision circuit comprises a noncoincidence detection circuit which detects noncoincidence between the input and the output of the flip-flop, a delay element which delays an output of the AND circuit, and a logic circuit which performs operation based on an output of the noncoincidence detection circuit and an output of the delay element,
the logic circuit comprises a p-channel transistor which receives the output of the delay element at a gate thereof and which is connected to a power supply at a source thereof, a first n-channel transistor which receives the output of the noncoincidence detection circuit and which is connected to a drain of the p-channel transistor at a drain thereof, and a second n-channel transistor which receives the output of the delay element at a gate thereof, which is connected to a source of the first n-channel transistor at a drain thereof, and which is grounded at a source thereof, and the request signal is output from a common connection node of the p-channel transistor and the first n-channel transistor, and
the AND circuit performs AND operation based on the second clock signal and an output of the logic circuit, and sends the first clock signal to the flip-flop and the delay element as an output.

4. The flip-flop circuit according to claim 1, wherein
the flip-flop comprises a first latch circuit which operates based on the first clock signal, and a second latch circuit which is connected to the first latch circuit in series and which operates based on an inverted signal of the first clock signal,
the control circuit comprises an AND circuit,
the decision circuit comprises a noncoincidence detection circuit which detects noncoincidence between the input and the output of the flip-flop, a delay element which delays an output of the AND circuit, and a logic circuit which performs operation based on an output of the noncoincidence detection circuit and an output of the delay element,
the noncoincidence detection circuit comprises a first transfer gate which exercises control of input taking in or interception of the second latch circuit based on an inverted signal of input data of the flip-flop, and a second transfer gate which exercises control of output taking in or interception of the second latch circuit on the basis of input data of the flip-flop, and output terminals of the first and second transfer gates are connected in common,
the logic circuit comprises a p-channel transistor which receives the output of the delay element at a gate thereof and which is connected to a power supply at a source thereof, a first n-channel transistor which receives the output of the noncoincidence detection circuit and which is connected to a drain of the p-channel transistor at a drain thereof, and a second n-channel transistor which receives the output of the delay element at a gate thereof, which is connected to a source of the first n-channel transistor at a drain thereof, and which is grounded at a source thereof, and the request signal is output from a common connection node of the p-channel transistor and the first n-channel transistor, and the AND circuit performs AND operation based on the second clock signal and an output of the logic circuit, and sends the first clock signal to the flip-flop and the delay element as an output.

5. The flip-flop circuit according to claim 1, wherein
the control circuit comprises an AND circuit,
the decision circuit comprises a noncoincidence detection circuit which detects noncoincidence between the input and the output of the flip-flop, a logic circuit which performs NAND operation based on an output of the AND circuit and an output of the noncoincidence detection circuit, and a delay element which delays an output of the logic circuit, and
the AND circuit performs AND operation based on the second clock signal, the output of the noncoincidence detection circuit, and an output of the delay element, and sends the first clock signal to the flip-flop and the logic circuit as an output.

6. The flip-flop circuit according to claim 1, wherein
the flip-flop comprises a first latch circuit which operates based on the first clock signal, and a second latch circuit which is connected to the first latch circuit in series and which operates on the basis of an inverted signal of the first clock signal,
the control circuit comprises a first inverter which inverts the second clock signal, a first NOR circuit, and a second inverter which inverts an output of the first NOR circuit,
the decision circuit comprises a noncoincidence detection circuit which detects noncoincidence between the input and the output of the flip-flop, a third inverter which inverts an output of the noncoincidence detection circuit, and a second NOR circuit which performs NOR operation based on an output of the third inverter and an output of the second inverter,
the noncoincidence detection circuit comprises a first transfer gate which exercises control of input taking in or interception of the second latch circuit based on an inverted signal of input data of the flip-flop, and a second transfer gate which exercises control of output taking in or interception of the second latch circuit based on input data of the flip-flop, and output terminals of the first and second transfer gates are connected in common, and
the first NOR circuit performs NOR operation based on an inverted value of the second clock signal, an output of the noncoincidence detection circuit, and an output of the second NOR circuit.

7. The flip-flop circuit according to claim 1, wherein
the control circuit comprises an AND circuit,
the decision circuit comprises a noncoincidence detection circuit which detects noncoincidence between the input and the output of the flip-flop, a delay element which delays an output of the AND circuit, and a logic circuit which performs NAND operation based on a test mode signal, an output of the noncoincidence detection circuit and an output of the delay element, and outputs the request signal, and
the AND circuit performs AND operation based on the second clock signal and an output of the logic circuit, and sends the first clock signal to the flip-flop and the delay element as an output.

8. The flip-flop circuit according to claim 1, wherein
the control circuit comprises an AND circuit,
the decision circuit comprises a noncoincidence detection circuit which detects noncoincidence between the input and the output of the flip-flop, a logic circuit which performs NAND operation based on a test mode signal, an output of the noncoincidence detection circuit and an output of the AND circuit, and a delay element which delays an output of the logic circuit, and the AND circuit performs AND operation based on the second clock signal, the output of the noncoincidence detection circuit, and an output of the delay element, and sends the first clock signal to the flip-flop and the logic circuit as an output.

9. A pipeline system comprising:

a plurality of sets each including a flip-flop and a logic circuit connected in series, wherein the flip-flop in at least one set is the flip-flop circuit according to claim 1.

10. The pipeline system according to claim 9, wherein a logic circuit is omitted in at least one set.

11. The pipeline system according to claim 9, wherein the control circuit comprises an AND circuit, the decision circuit comprises a noncoincidence detection circuit which detects noncoincidence between the input and the output of the flip-flop, a delay element which delays an output of the AND circuit, and a logic circuit which performs NAND operation based on an output of the noncoincidence detection circuit and an output of the delay element, and outputs the request signal, and the AND circuit performs AND operation based on the second clock signal and an output of the logic circuit, and sends the first clock signal to the flip-flop and the delay element as an output.

12. The pipeline system according to claim 9, wherein the control circuit comprises an AND circuit, the decision circuit comprises a noncoincidence detection circuit which detects noncoincidence between the input and the output of the flip-flop, a delay element which delays an output of the AND circuit, and a logic circuit which performs operation based on an output of the noncoincidence detection circuit and an output of the delay element, the logic circuit comprises a p-channel transistor which receives the output of the delay element at a gate thereof and which is connected to a power supply at a source thereof, a first n-channel transistor which receives the output of the noncoincidence detection circuit and which is connected to a drain of the p-channel transistor at a drain thereof, and a second n-channel transistor which receives the output of the delay element at a gate thereof, which is connected to a source of the first n-channel transistor at a drain thereof, and which is grounded at a source thereof, and the request signal is output from a common connection node of the p-channel transistor and the first n-channel transistor, the AND circuit performs AND operation based on the second clock signal and an output of the logic circuit, and sends the first clock signal to the flip-flop and the delay element as an output.

13. The pipeline system according to claim 9, wherein the flip-flop comprises a first latch circuit which operates based on the first clock signal, and a second latch circuit which is connected to the first latch circuit in series and which operates based on an inverted signal of the first clock signal, the control circuit comprises an AND circuit, the decision circuit comprises a noncoincidence detection circuit which detects noncoincidence between the input and the output of the flip-flop, a delay element which delays an output of the AND circuit, and a logic circuit which performs operation based on an output of the noncoincidence detection circuit and an output of the delay element, the noncoincidence detection circuit comprises a first transfer gate which exercises control of input taking in or interception of the second latch circuit based on an inverted signal of input data of the flip-flop, and a second transfer gate which exercises control of output taking in or interception of the second latch circuit on the basis of input data of the flip-flop, and output terminals of the first and second transfer gates are connected in common, the logic circuit comprises a p-channel transistor which receives the output of the delay element at a gate thereof and which is connected to a power supply at a source thereof, a first n-channel transistor which receives the output of the noncoincidence detection circuit and which is connected to a drain of the p-channel transistor at a drain thereof, and a second n-channel transistor which receives the output of the delay element at a gate thereof, which is connected to a source of the first n-channel transistor at a drain thereof, and which is grounded at a source thereof, and the request signal is output from a common connection node of the p-channel transistor and the first n-channel transistor, and the AND circuit performs AND operation based on the second clock signal and an output of the logic circuit, and sends the first clock signal to the flip-flop and the delay element as an output.

14. The pipeline system according to claim 9, wherein the control circuit comprises an AND circuit, the decision circuit comprises a noncoincidence detection circuit which detects noncoincidence between the input and the output of the flip-flop, a logic circuit which performs NAND operation based on an output of the AND circuit and an output of the noncoincidence detection circuit, and a delay element which delays an output of the logic circuit, and the AND circuit performs AND operation based on the second clock signal, the output of the noncoincidence detection circuit, and an output of the delay element, and sends the first clock signal to the flip-flop and the logic circuit as an output.

15. The pipeline system according to claim 9, wherein the flip-flop comprises a first latch circuit which operates based on the first clock signal, and a second latch circuit which is connected to the first latch circuit in series and which operates on the basis of an inverted signal of the first clock signal, the control circuit comprises a first inverter which inverts the second clock signal, a first NOR circuit, and a second inverter which inverts an output of the first NOR circuit, the decision circuit comprises a noncoincidence detection circuit which detects noncoincidence between the input and the output of the flip-flop, a third inverter which inverts an output of the noncoincidence detection circuit, and a second NOR circuit which performs NOR operation based on an output of the third inverter and an output of the second inverter, the noncoincidence detection circuit comprises a first transfer gate which exercises control of input taking in or interception of the second latch circuit based on an inverted signal of input data of the flip-flop, and a second transfer gate which exercises control of output taking in or interception of the second latch circuit based on input data of the flip-flop, and output terminals of the first and second transfer gates are connected in common, and the first NOR circuit performs NOR operation based on an inverted value of the second clock signal, an output of the noncoincidence detection circuit, and an output of the second NOR circuit.

16. The pipeline system according to claim 9, wherein
the control circuit comprises an AND circuit,
the decision circuit comprises a noncoincidence detection circuit which detects noncoincidence between the input and the output of the flip-flop, a delay element which delays an output of the AND circuit, and a logic circuit which performs NAND operation based on a test mode signal, an output of the noncoincidence detection circuit and an output of the delay element, and outputs the request signal, and
the AND circuit performs AND operation based on the second clock signal and an output of the logic circuit, and sends the first clock signal to the flip-flop and the delay element as an output.

17. The pipeline system according to claim 9, wherein the control circuit comprises an AND circuit,
the decision circuit comprises a noncoincidence detection circuit which detects noncoincidence between the input and the output of the flip-flop, a logic circuit which performs NAND operation based on a test mode signal, an output of the noncoincidence detection circuit and an output of the AND circuit, and a delay element which delays an output of the logic circuit, and
the AND circuit performs AND operation based on the second clock signal, the output of the noncoincidence detection circuit, and an output of the delay element, and sends the confirmation signal to the flip-flop and the logic circuit as an output.

18. The flip-flop circuit according to claim 7, wherein the delay element includes at least a CMOS inverter.

* * * * *